(12) United States Patent
Sato et al.

(10) Patent No.: US 8,365,615 B2
(45) Date of Patent: Feb. 5, 2013

(54) PIEZOELECTRIC VIBRATION TYPE FORCE SENSOR

(75) Inventors: Shuuichi Sato, Kawasaki (JP); Yuichi Someya, Tokyo (JP); Hideyuki Nishida, Yokohama (JP); Takao Yokomatsu, Yokohama (JP); Kentaro Nakamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 243 days.

(21) Appl. No.: 12/743,076

(22) PCT Filed: Jan. 20, 2009

(86) PCT No.: PCT/JP2009/051147
§ 371 (c)(1),
(2), (4) Date: May 14, 2010

(87) PCT Pub. No.: WO2009/093727
PCT Pub. Date: Jul. 30, 2009

(65) Prior Publication Data
US 2011/0113898 A1    May 19, 2011

(30) Foreign Application Priority Data

Jan. 22, 2008 (JP) ................................. 2008-011626
Jan. 16, 2009 (JP) ................................. 2009-007768

(51) Int. Cl.
*G01L 1/10* (2006.01)
(52) U.S. Cl. .................................................. 73/862.59
(58) Field of Classification Search ................. 73/862.59
See application file for complete search history.

(56) References Cited

U.S. PATENT DOCUMENTS

| 4,798,987 A | 1/1989 | Nakamura |
| 5,200,663 A | 4/1993 | Mochizuki et al. |

(Continued)

FOREIGN PATENT DOCUMENTS

| JP | 52-78483 A | 7/1977 |
| JP | 60-187834 A | 9/1985 |

(Continued)

OTHER PUBLICATIONS

International Preliminary Report on Patentability dated Aug. 5, 2010 in corresponding PCT Patent Application No. PCT/JP2009/051147.

(Continued)

*Primary Examiner* — Lisa Caputo
*Assistant Examiner* — Octavia Davis-Hollington
(74) *Attorney, Agent, or Firm* — Fitzpatrick, Cella, Harper & Scinto

(57) ABSTRACT

In a piezoelectric vibration type force sensor according to the present invention, vibration is restricted by a friction force between a piezoelectric body and a restricting member, and hence a range of sensing forces can be expanded compared with a case in which the vibration is restricted directly from a direction that is the same as an vibration direction. A conventional structure, in which a lead wire is soldered directly for electrically connecting the piezoelectric body to an external control circuit, causes a restriction of the vibration due to a solder attached to the piezoelectric body, resulting in narrowing the sensing range. Using the piezoelectric vibration type force sensor, the range of sensing forces can be expanded by making a state in which conducting portions of the piezoelectric body and the restricting member are not fixed but contact with each other for keeping electric conductivity.

5 Claims, 5 Drawing Sheets

U.S. PATENT DOCUMENTS

| | | | |
|---|---|---|---|
| 5,367,216 | A | 11/1994 | Egara et al. |
| 5,499,541 | A | 3/1996 | Hopf et al. |
| 5,606,263 | A | 2/1997 | Yoshizawa et al. |
| 7,109,718 | B2 | 9/2006 | Shimizu et al. |
| 7,685,733 | B2 * | 3/2010 | Ohmori et al. ............ 33/559 |
| 2009/0021113 | A1 | 1/2009 | Negishi et al. |

FOREIGN PATENT DOCUMENTS

| | | |
|---|---|---|
| JP | 60-222734 A | 11/1985 |
| JP | 4048595 B | 8/1992 |
| JP | 2000-205934 A | 7/2000 |

OTHER PUBLICATIONS

Korean Office Action dated Apr. 30, 2012 in corresponding Korean Application No. 10-2010-7017815.

Taiwanse Office Action dated Sep. 4, 2012 in corresponding Taiwanese Patent Application No. 098102598.

* cited by examiner

PRIOR ART

PIEZOELECTRIC VIBRATION TYPE FORCE SENSOR

This application is a National Stage application under 35 U.S.C. §371 of International Application No. PCT/JP2009/051147, filed on Jan. 20, 2009, which claims priority to Japanese Application No. 2008-011626, filed on Jan. 22, 2008, and Japanese Application No. 2009-007768, filed on Jan. 16, 2009, the contents of each of the foregoing applications being incorporated by reference herein.

TECHNICAL FIELD

The present invention relates to a force sensor using a piezoelectric body for sensing force, in particular, a piezoelectric vibration type force sensor utilizing a resonance phenomenon of a piezoelectric body for sensing a static force.

BACKGROUND ART

As conventional force sensors, a strain gauge, a capacitive force sensors, a conductive rubber, and the like are developed. Each of the force sensors using those utilizes deformation of a member, and thus it is necessary to secure a sufficient amount of the deformation for realizing high sensitivity and a wider dynamic range of measurement. Therefore, if the sensor is downsized, sufficient deformation amount cannot be obtained. As a result, there arises a problem that an output signal is buried in noise to deteriorate accuracy.

As a countermeasure against the problem, there is provided a sensor utilizing a resonance phenomenon of a piezoelectric body as described in Japanese Patent Application Laid-Open No. S52-078483. The piezoelectric body has a property of vibrating in a specific direction when a voltage which temporally changes (e.g., alternating voltage) is applied, according to time variation of amplitude of the voltage.

According to the technique described in Japanese Patent Application Laid-Open No. S52-078483, an impedance 6 is connected in series to the piezoelectric body first, and a voltage having a fixed frequency that is not higher than a resonance frequency of a piezoelectric body 1 is applied from a power supply 7, whereby the piezoelectric body is vibrated. If a force is exerted on the piezoelectric body in this state, the impedance of the piezoelectric body increases so that the resonance frequency of the piezoelectric body is shifted to a high frequency side. In the shifted state, a value of the voltage applied to the piezoelectric body 1 is changed from the value before the force is exerted. According to this change of the voltage value, magnitude of the force that has exerted on the piezoelectric body can be quantitatively calculated (see FIG. 8).

The piezoelectric vibration type force sensor described in Japanese Patent Application Laid-Open No. S52-078483 has an advantage that its sensitivity is high with a low load because variation of the voltage amplitude is large. However, as an external force exerted on the sensor increases, the variation of the voltage amplitude decreases. Thus, its sensing range is narrow.

As a countermeasure against this problem, there are proposed methods for expanding the sensing range in Japanese Patent Application Laid-Open No. S60-187834 and Japanese Patent Application Laid-Open No. S60-222734.

First, Japanese Patent Application Laid-Open No. S60-187834 is characterized in that a structure in which two piezoelectric bodys are bonded to each other, i.e., a so-called bimorph type piezoelectric body is used. One end of this bimorph piezoelectric body is fixed while the other end is made to be a free end, whereby a force is exerted on the piezoelectric body. In addition, a frequency signal higher than a resonance point of the piezoelectric body is applied to the same. This sensor has the structure in which two piezoelectric bodys are bonded to each other, and hence amplitude thereof can be made larger, with the result that the range of sensing forces can be expanded.

Next, as to Japanese Patent Application Laid-Open No. S60-222734, a phase angle difference between the voltage applied to the piezoelectric body and a terminal voltage of the piezoelectric body, which is caused by the external force, is sensed to control the frequency so that the phase angle difference becomes a set value. This frequency variation is utilized for sensing the force. Thus, the sensitivity can be uniform and the sensing range can be made wider.

However, the invention of Japanese Patent Application Laid-Open No. S60-187834 uses the bimorph piezoelectric body. The bimorph piezoelectric body has the structure in which two piezoelectric elements are bonded to each other, and hence it is disadvantageous for cost reduction and downsizing.

In addition, the invention of Japanese Patent Application Laid-Open No. S60-187834 senses the phase angle difference between the voltage applied to the piezoelectric body and the terminal voltage of the piezoelectric body, which is caused by the external force, thereby controlling the frequency so that the phase angle difference becomes a set value. However, an additional phase angle sensing circuit and an additional phase angle setting circuit are necessary, resulting in complication of the circuit. Therefore, it is also disadvantageous for cost reduction and downsizing.

DISCLOSURE OF THE INVENTION

The present invention has been made to solve the problems described above, and it is an object thereof to provide a piezoelectric vibration type force sensor capable of sensing static forces in a wider range with a simple structure.

In order to achieve the above-mentioned object, there is provided a method of sensing a force including:

applying a voltage which temporally changes to a piezoelectric body to vibrate the piezoelectric body in a specific direction;

causing a restricting member to abut against the piezoelectric body to be vibrated in a slidable manner, the restricting member being deformed elastically to transmit a force to the piezoelectric body when receiving the force externally; and sensing a force exerted from an impedance of the piezoelectric body, which changes in accordance with a friction force generated between the piezoelectric body and the restricting member by the force exerted on the restricting member.

Further, in order to achieve the above-mentioned object, there is provided a piezoelectric vibration type force sensor including:

a piezoelectric body that vibrates in a specific direction when a voltage which temporally changes is applied;

a pair of drive electrodes provided on surfaces of the piezoelectric body; and a restricting member deformed elastically to transmit a force to the piezoelectric body when receiving the force externally, wherein the restricting member is held in a slidable manner with respect to the piezoelectric body on which the pair of drive electrodes are provided, and an exerted force is sensed by sensing an impedance of the piezoelectric body, which changes in accordance with a friction force generated by the force exerted on the piezoelectric body via the restricting member, in a state in which the voltage is applied to vibrate the piezoelectric body.

According to the structure described above, the present invention can expand the range of sensing forces because the vibration is restricted by the friction between the piezoelectric body and the restricting member, compared with the conventional structure in which the vibration is restricted directly from the direction that is the same as the vibration direction.

In addition, if a thickness of the piezoelectric body is decreased so that a distance between surfaces of a pair of drive electrodes opposed to each other is decreased more for thinning and downsizing the sensor, a primary mode of the vibration becomes a lateral effect. Therefore, a polarization direction and the vibration direction become perpendicular to each other. In other words, the restricting member is provided on the surface in a twisted position with respect to the vibration direction of the piezoelectric body, and hence the disposed position is resistant to interference of the vibration. Therefore, this structure is appropriate also in a mounting aspect compared with the conventional sensor.

As described above, according to the present invention, it is possible to provide the piezoelectric vibration type force sensor capable of sensing static forces in a wider range with a simple structure.

Further features of the present invention will become apparent from the following description of exemplary embodiments with reference to the attached drawings.

BEST MODE FOR CARRYING OUT THE INVENTION

Figure 1:
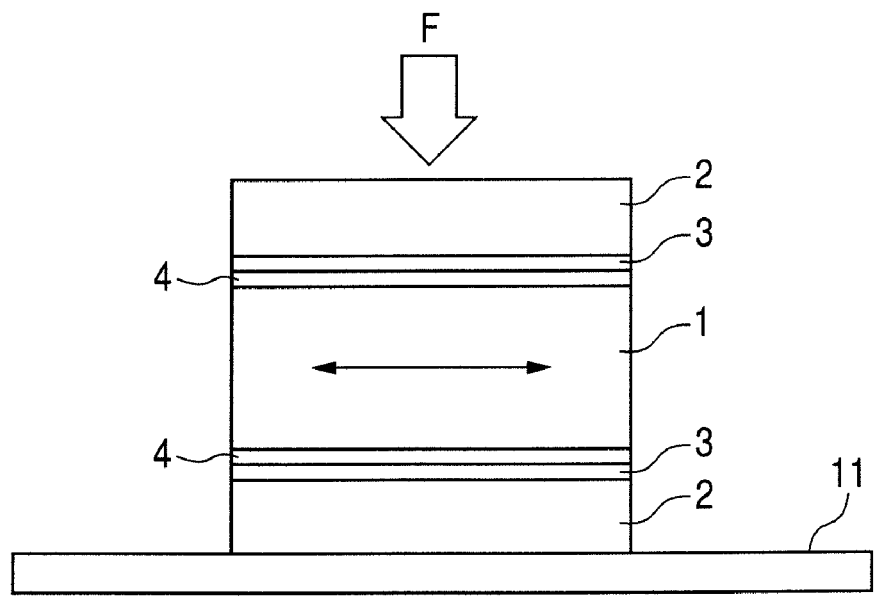
FIG. 1 is a diagram illustrating a structure of a piezoelectric vibration type force sensor according to the present invention.
Figure 3:
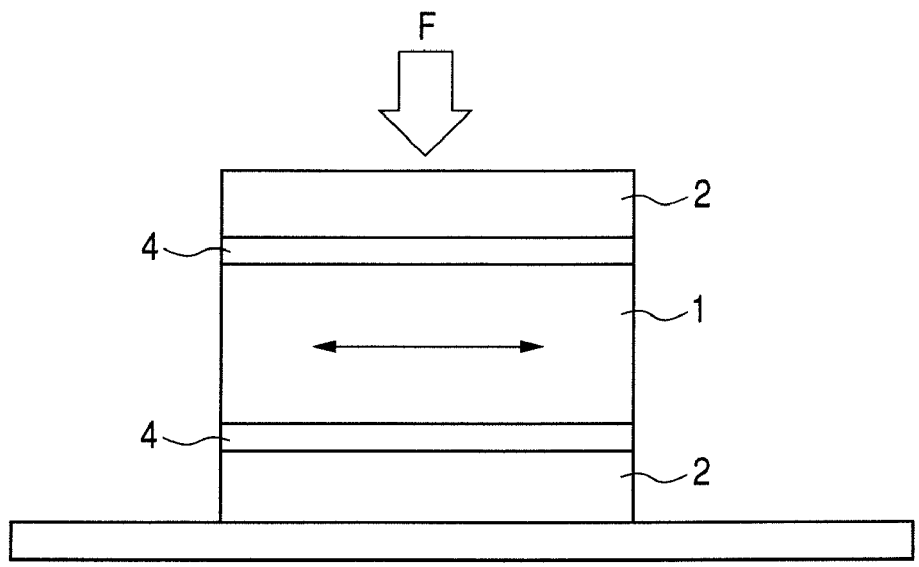
FIG. 3 is a diagram illustrating another structure of the piezoelectric vibration type force sensor according to the present invention.

FIG. 1 is a diagram illustrating a feature of the present invention in the best manner as a cross section of a piezoelectric vibration type force sensor which includes a piezoelectric body 1, a restricting member 2 on which a force is exerted, an electrode 3 for extracting a signal from a drive electrode, and the drive electrode 4 for applying a voltage to the piezoelectric body to be vibrated. The piezoelectric vibration type force sensor having the structure described above is supported on a mounting surface 11. FIG. 1 is a diagram for illustrating a principle of the sensor of the present invention for sensing a force, which includes the piezoelectric body 1, the restricting member 2, and the drive electrode 3. Other fixing members except the mounting surface 11 are not illustrated in FIG. 1. Other than the mounting surface, various forms for fixing the sensor can be adopted. For instance, an outer rim of the sensor may be surrounded by a member having such elastic properties that do not prevent the piezoelectric body from being vibrated substantially. Otherwise, a known fixing method may be adopted. Further, as illustrated in FIG. 3, when a conductive member such as a conductive rubber is used as the restricting member, the electrode 3 can be eliminated.

The piezoelectric body 1 may be a piezoelectric element made of crystal, barium titanate, or polyvinylidene fluoride. The restricting member 2 may be made of a material that can be deformed elastically like silicone or polyurethane. This is because that if a hard member (having significantly large elastic constant) abuts directly against the piezoelectric body, the vibration is decreased rapidly, with the result that the sensing operation becomes difficult.

The piezoelectric body 1 is provided with a pair of drive electrodes 4 that are opposed to each other, and a voltage which temporally changes is applied to the drive electrodes, whereby the piezoelectric body can vibrate. As for a vibration direction, a cut-out shape of the piezoelectric body determines the principal vibration direction, whereby the vibration direction in a primary mode can be determined.

With respect to the drive electrodes 4 provided on the piezoelectric body 1, the lead electrodes 3 are attached to the restricting members 2 in sheet form, and the lead electrodes 3 and the drive electrodes 4 are brought into slidable contact with each other.

Adopting this structure, the vibration can be restricted by a friction force generated on a surface contacting with the piezoelectric body and the restricting member. As illustrated in FIG. 1, it is the feature of the present invention to restrict the vibration by utilizing the friction with respect to the vibration direction of the piezoelectric body. For this purpose, it is necessary to adopt the structure in which the restricting member abuts against the surface of the piezoelectric body provided at a position that is not perpendicular to (or is twisted from) the vibration direction. On this occasion, it is advantageous for mounting the restricting member if the restricting member is substantially in parallel with the vibration direction so as not to cross the vibration direction, because the restricting member does not interfere directly with a vibration surface of the piezoelectric body.

In the conventional piezoelectric vibration type force sensor, the restricting member is abutted against the vibration surface by an external force F so as to restrict the vibration directly. In contrast, the present invention restricts the vibration by a friction force $\mu F$ when coefficient of kinetic friction is expressed by $\mu$. Therefore, theoretically, if $\mu$ is 0.5, it is possible to sense a force to the extent of approximately twice compared with the case where the vibration is directly restricted like the conventional sensor. If $\mu$ is 0.1, it is possible to sense a force to the extent of approximately ten times. In other words, in the piezoelectric vibration type force sensor, by utilizing the friction force for restricting the vibration, it is possible to sense static forces in a wide range.

Figure 2:
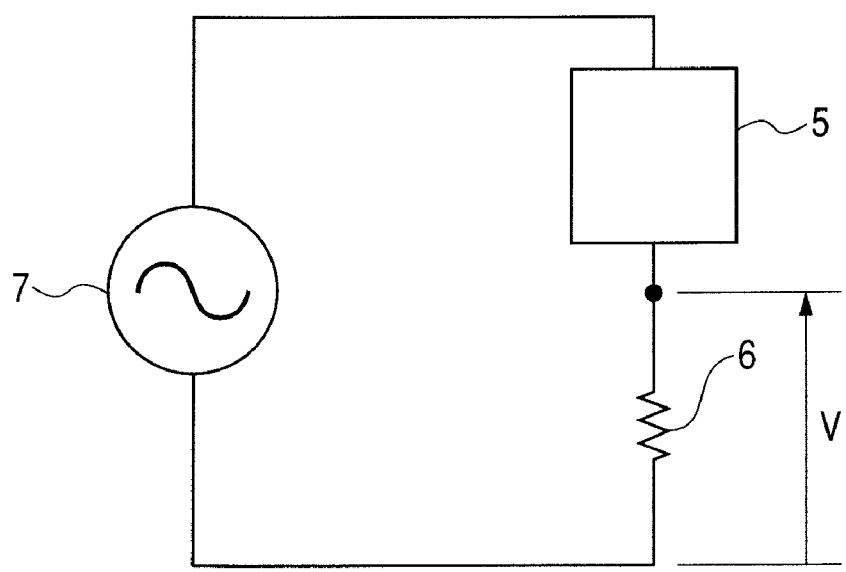
FIG. 2 is a diagram for illustrating a measurement principle of the present invention.
Figure 4:
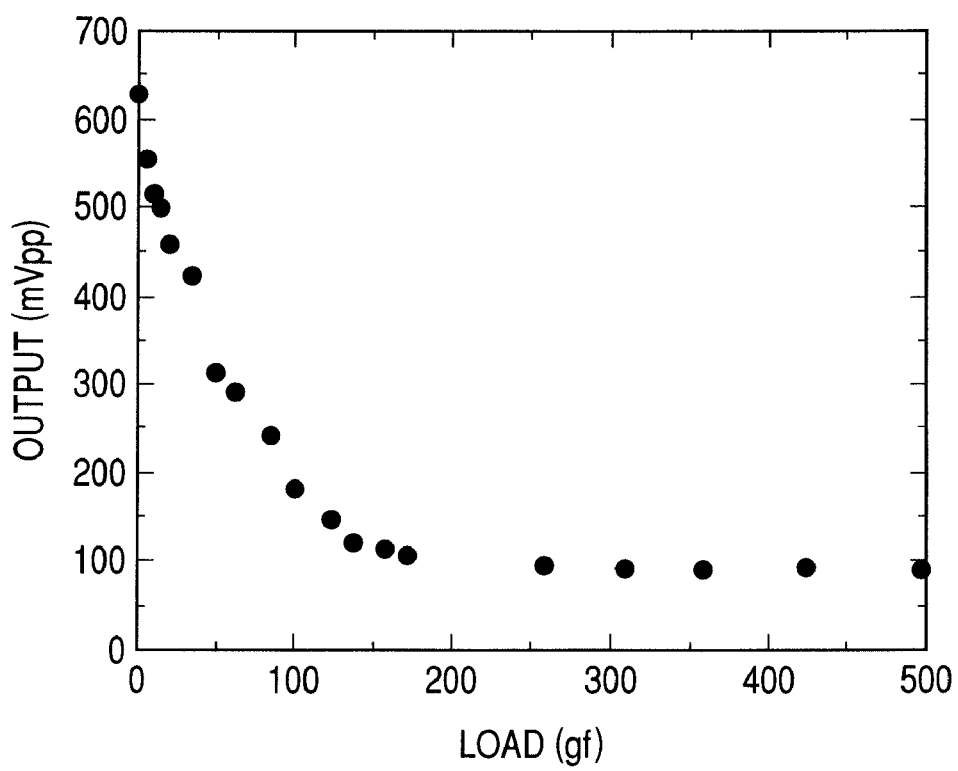
FIG. 4 is a graph showing a relationship between a force and an output voltage.

As illustrated in FIG. 2, a variable frequency oscillator 7 applies a voltage having a frequency in the vicinity of a resonance frequency of the piezoelectric body to the piezoelectric body 1 of a force sensor 5 via an impedance 6 made up of a resistor or the like, whereby the piezoelectric body is vibrated. In this state, if a force is exerted on the restricting member 2, the vibration of the piezoelectric body 1 is restricted by the restricting member 2. Thus, an impedance of the piezoelectric body is increased, and hence a voltage amplitude across the impedance 6 varies. As a result, a relationship between the force and an output voltage as illustrated in FIG. 4 is obtained. From this varying impedance, the force is sensed.

Experimental Example 1

Figure 5:
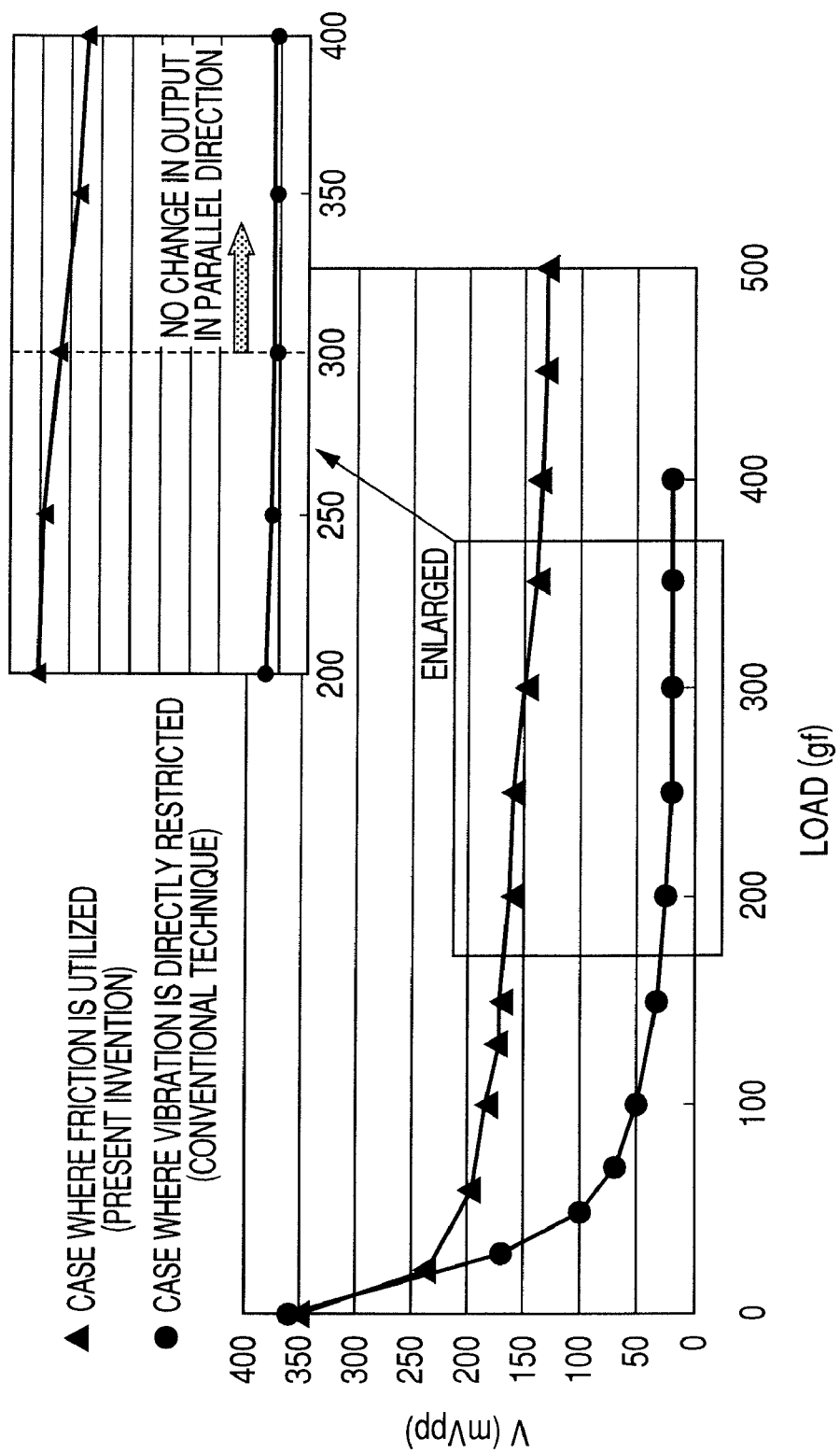
FIG. 5 is a graph showing a result of exertions of forces in a direction parallel to a vibration direction and in a direction perpendicular thereto.

FIG. 5 illustrates a result of comparison between the case (conventional technique) in which a cylindrical piezoelectric body having a diameter of 5.0 mm and a thickness of 9.8 mm is used for directly restricting the vibration direction and the case (the present invention) in which the friction is utilized for exerting the force in a direction perpendicular to the vibration direction. Here, the piezoelectric body was provided with the drive electrode provided at a restricting position and was applied with an alternating voltage. A primary resonance frequency became 145 kHz, and a vibration mode became vertical effect. In addition, a polyurethane rubber having a thickness of 1 mm was used as the restricting member.

A point at which an output voltage amplitude does not change even if the force is further exerted on the restricting member is regarded as a force sensing limit. When the force was exerted in a parallel direction (in the case of restricting the vibration of the piezoelectric body directly), the force sensing limit was approximately 300 gf. In contrast, when the force was exerted in the perpendicular direction (in the case of restricting the vibration of the piezoelectric body by utilizing the friction force), the force sensing limit was approximately 400 gf.

Therefore, it is understood that the force sensing limit becomes larger if the force is exerted in the direction perpendicular to the vibration direction. In other words, the method of restricting the vibration of the piezoelectric body by the friction is effective for expanding the range of sensing forces.

Figure 6:
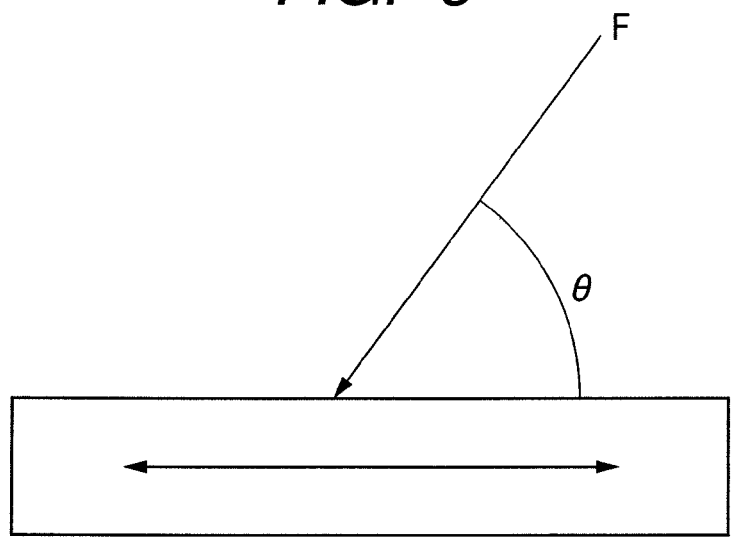
FIG. 6 is a diagram illustrating a relationship between the vibration direction of the piezoelectric body and a direction in which the force is exerted.
Figure 7:
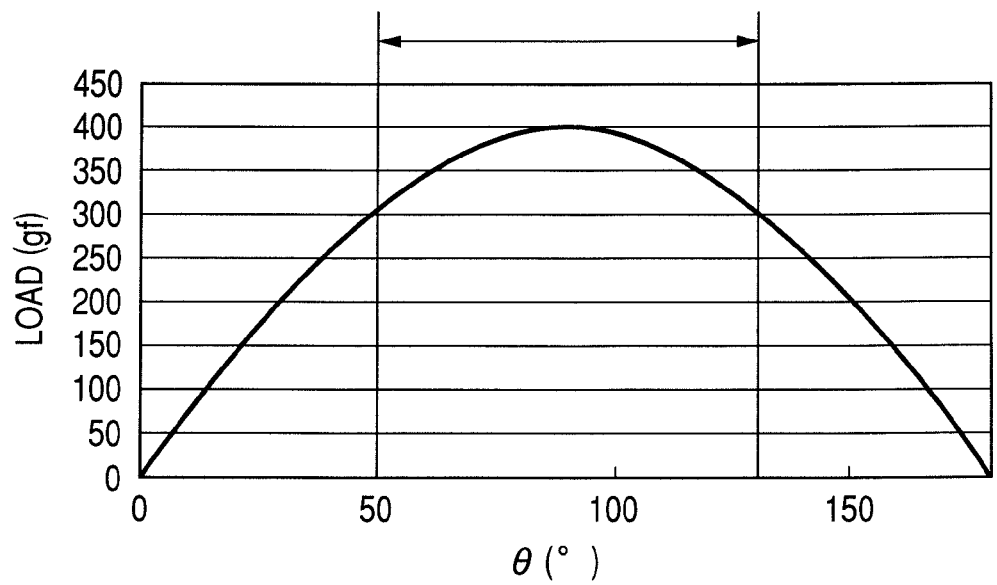
FIG. 7 is a graph showing an influence of the direction in which the force is exerted with respect to the vibration direction of the piezoelectric body.
Figure 8:
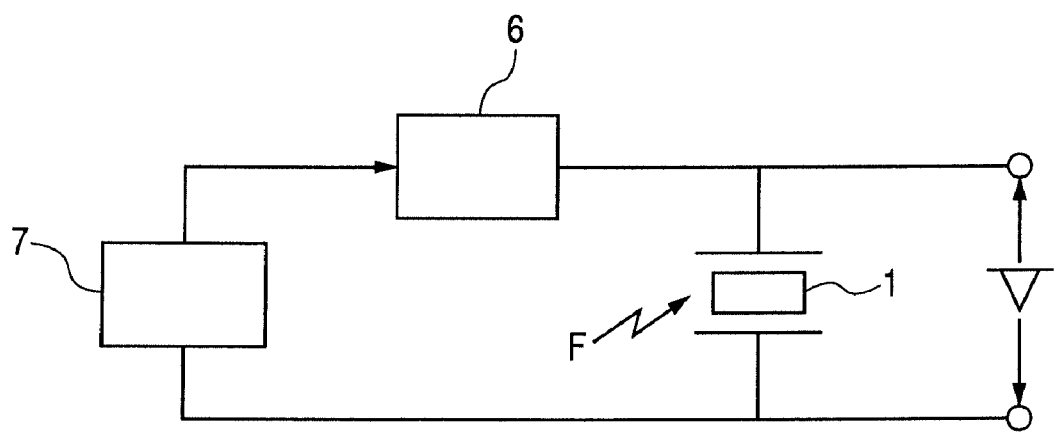
FIG. 8 is a diagram illustrating a conventional piezoelectric vibration type force sensor.

As for the experimental results described above, the vibration direction and the direction in which the force was exerted were perpendicular to each other ($\theta=90$ degrees) (see FIG. 6). Therefore, based on the experimental results when the force was exerted in the perpendicular direction, a relationship between the force exerted on the piezoelectric body and the angle $\theta$ between the vibration direction and the direction in which the force was exerted was studied. The result thereof is illustrated in FIG. 7. The angle $\theta$ was changed on a condition that the force F was 400 gf. Thus, in the experimental model of this time, for instance, the force sensing limit in the parallel direction was 300 gf. Therefore, in a range of 50 degrees$\leq\theta\leq$130 degrees as to the direction in which the force is exerted with respect to the vibration direction, the conventional sensing method is out of the sensing limit. Therefore, using the method of the present invention, the range of sensing forces can be expanded so as to eliminate the range in which the force cannot be sensed. In the ideal state in which there is provided no slip on the surface receiving the force of the restricting member, the force can be sensed as long as the angle $\theta$ is larger than zero. It is possible to adopt the structure in which elastic characteristics of the restricting member, surface characteristics of the same such as surface roughness, a method of contacting with the piezoelectric body, and the like are determined appropriately so that the force can be sensed in a desired angle.

Experimental Example 2

Table 1 shows a result of studying influence of the electrode for electrically connecting the piezoelectric body to an external control circuit. As the piezoelectric body, a disk element (having a diameter of 2 mm and a thickness of 0.5 mm) and a ring element (having an outer diameter of 2 mm, an inner diameter of 1 mm, and a thickness 0.5 mm) were used. Output voltages when a load of 20 gf was applied are shown in Table 1. As to "with solder", a lead wire was directly connected to the piezoelectric body by soldering. In contrast, as to "without solder", aluminum foil was provided on the surface of the restricting member so as to keep electric conductivity by contact.

TABLE 1

| Element | Electrode | Output voltage (at load of 20 gf) |
| --- | --- | --- |
| 2 mm ring | with solder | 212 mV |
|  | without solder | 436 mV |
| 2 mm disk | with solder | 424 mV |
|  | without solder | 732 mV |

From the experimental results, it is confirmed that "without solder" can obtain the output voltage of approximately twice larger than "with solder" both in the case of the ring element and in the case of the disk element. Therefore, the range of sensing forces can be expanded by making the state in which electrically conducting portions of the piezoelectric body and the restricting member are not fixed but contact with each other for keeping electric conductivity.

The conventional structure, in which the lead wire is soldered directly for electrically connecting the piezoelectric body to the external control circuit, causes a restriction of the vibration due to the solder attached to the piezoelectric body, resulting in narrowing the sensing range. Using the present invention, the range of sensing forces can be expanded by making the state in which the conducting portions of the piezoelectric body and the restricting member are not fixed but contact with each other for keeping electric conductivity (are restricted by friction).

In addition, the present invention can also resolve various problems due to soldering, which includes variation of the vibration characteristic of an oscillator due to a soldering state and a dropout of the lead wire due to a malfunction of soldering.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-011626, filed Jan. 22, 2008, and No. 2009-007768, filed Jan. 16, 2009, which are hereby incorporated by reference herein in their entirety.

The invention claimed is:

1. A method of sensing a force, comprising:
    applying a voltage, which temporally changes, to a piezoelectric body to vibrate the piezoelectric body in a specific direction;
    causing a restricting member to abut against the piezoelectric body to be vibrated in a slidable manner, wherein the restricting member transmits a force to the piezoelectric body when receiving the force externally; and
    sensing a force which is received by the restricting member from the outside, using an impedance of the piezoelectric body, which changes by the force exerted on the restricting member.

2. The method of sensing a force according to claim 1, wherein the restricting member is provided in a direction along a vibration direction of the piezoelectric body.

3. A piezoelectric vibration type force sensor, comprising:
a piezoelectric body that vibrates in a specific direction when a voltage which temporally changes is applied;
a pair of drive electrodes provided on surfaces of the piezoelectric body; and
a restricting member which transmits a force to the piezoelectric body when receiving the force externally, wherein
the restricting member is held in a slidable manner with respect to the piezoelectric body on which the pair of drive electrodes are provided, and a force which is received by the restricting member from the outside is sensed, using an impedance of the piezoelectric body, which changes, in a state in which the voltage is applied to vibrate the piezoelectric body.

4. The piezoelectric vibration type force sensor according to claim 3, wherein the restricting member is provided in a direction along a vibration direction of the piezoelectric body on which the pair of drive electrodes are provided.

5. The piezoelectric vibration type force sensor according to claim 3, wherein the restricting member has a lead electrode provided on a surface contacting with each of the pair of drive electrodes.

* * * * *